(12) United States Patent
Rueger et al.

(10) Patent No.: US 6,705,291 B2
(45) Date of Patent: Mar. 16, 2004

(54) FUEL INJECTION SYSTEM

(75) Inventors: Johannes-Jörg Rueger, Vaihingen/enz (DE); Matthias Mrosik, Stuttgart (DE); Volker Pitzal, Waldstetten/Wissgoldingen (DE); Bertram Sugg, Gerlingen (DE); Friedrich Boecking, Stuttgart (DE); Udo Schulz, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/824,195

(22) Filed: Apr. 2, 2001

(65) Prior Publication Data

US 2002/0000218 A1 Jan. 3, 2002

(30) Foreign Application Priority Data

Apr. 1, 2000 (EP) .............................. 00106973

(51) Int. Cl.$^7$ .............................. F02M 41/00
(52) U.S. Cl. .................. 123/467; 123/198 D; 123/498; 310/316.03
(58) Field of Search .............................. 123/498, 198 D, 123/479, 467, 357; 310/316.03, 317

(56) References Cited

U.S. PATENT DOCUMENTS

| 5,376,854 A | | 12/1994 | Oouchi | |
|---|---|---|---|---|
| 5,986,360 A | * | 11/1999 | Gerken et al. | 307/125 |
| 6,147,433 A | * | 11/2000 | Reineke et al. | 310/316.03 |

FOREIGN PATENT DOCUMENTS

| DE | 197 29 844 | | 7/1990 |
|---|---|---|---|
| DE | 197 42 073 | | 7/1990 |
| DE | 198 05 184 | | 8/1999 |
| DE | 198 41 002 | | 3/2000 |
| EP | 0 371 469 | | 6/1990 |
| EP | 0 379 182 | | 6/1990 |
| GB | 2263975 | | 8/1993 |
| JP | 58 011824 | | 1/1983 |
| JP | 04 166641 | | 6/1992 |
| WO | WO99/07026 | * | 2/1999 |

* cited by examiner

Primary Examiner—Carl S. Miller
(74) Attorney, Agent, or Firm—Kenyon & Kenyon

(57) ABSTRACT

Fuel injection system comprising a piezoelectric element for controlling the amount of injected fuel and further comprising a control unit for determination of a possible fault of the piezoelectric element or of an electric circuitry driving the piezoelectric element based upon a value related to the capacitance of the piezoelectric element.

26 Claims, 7 Drawing Sheets

FUEL INJECTION SYSTEM

The present invention relates to a fuel injection system as defined in the preamble of claim 1, and a method as defined in the preamble of claim 13.

The fuel injection system comprises piezoelectric elements being considered in more detail. Piezoelectric elements can be used as actuators because, as is known, they possess the property of contracting or expanding as a function of a voltage applied thereto or occurring therein.

The practical implementation of actuators using piezoelectric elements proves to be advantageous in particular if the actuator in question must perform rapid and/or frequent movements.

The use of piezoelectric elements as actuators proves to be advantageous, inter alia, in fuel injection nozzles for internal combustion engines. Reference is made, for example, to EP 0 371 469 B1 and to EP 0 379 182 B1 regarding the usability of piezoelectric elements in fuel injection nozzles.

Piezoelectric elements are capacitive elements which, as already partially alluded to above, contract and expand in accordance with the particular charge state or the voltage occurring therein or applied thereto. In the example of a fuel injection nozzle, expansion and contraction of piezoelectric elements is used to control valves that manipulate the linear strokes of injection needles. The use of piezoelectric elements with double acting, double seat valves to control corresponding injection needles in a fuel injection system is system is shown in German patent applications DE 197 42 073 A1 and DE 197 29 844 A1, which are incorporated herein in their entirety.

Fuel injection systems using piezoelectric elements are characterized by the fact that, to a first approximation, piezoelectric elements exhibit a proportional relationship between applied voltage and the linear expansion. In a fuel injection nozzle, for example, implemented as a double acting, double seat valve to control the linear stroke of a needle for fuel injection into a cylinder of an internal combustion engine, the amount of fuel injected into a corresponding cylinder is a function of the time the valve is open, and in the case of the use of a piezoelectric element, the activation voltage applied to the piezoelectric element.

FIG. 8 is a schematic representation of a fuel injection system using a piezoelectric element 2010 as an actuator. Referring to FIG. 8, the piezoelectric element 2010 is electrically energized to expand and contract in response to a given activation voltage. The piezoelectric element 2010 is coupled to a piston 2015. In the expanded state, the piezoelectric element 2010 causes the piston 2015 to protrude into a hydraulic adapter 2020 which contains a hydraulic fluid, for example fuel. As a result of the piezoelectric element's expansion, a double acting control valve 2025 is hydraulically pushed away from hydraulic adapter 2020 and the valve plug 2035 is extended away from a first closed position 2040. The combination of double acting control valve 2025 and hollow bore 2050 is often referred to as double acting, double seat valve for the reason that when piezoelectric element 2010 is in an unexcited state, the double acting control valve 2025 rests in its first closed position 2040. On the other hand, when the piezoelectric element 2010 is fully extended, it rests in its second closed position 2030. The later position of valve plug 2035 is schematically represented with ghost lines in FIG. 8.

The fuel injection system comprises an injection needle 2070 allowing for injection of fuel from a pressurized fuel supply line 2060 into the cylinder (not shown). When the piezoelectric element 2010 is unexcited or when it is fully extended, the double acting control valve 2025 rests respectively in its first closed position 2040 or in its second closed position 2030. In either case, the hydraulic rail pressure maintains injection needle 2070 at a closed position. Thus, the fuel mixture does not enter into the cylinder (not shown). Conversely, when the piezoelectric element 2010 is excited such that double acting control valve 2025 is in the so-called mid-position with respect to the hollow bore 2050, then there is a pressure drop in the pressurized fuel supply line 2060. This pressure drop results in a pressure differential in the pressurized fuel supply line 2060 between the top and the bottom of the injection needle 2070 so that the injection needle 2070 is lifted allowing for fuel injection into the cylinder (not shown).

It is an object of the present invention to identify defective piezoelectric elements.

This object is achieved, according to the present invention, by way of the features claimed in claim 1 and in the characterizing portion of claim 13. An inventive fuel injection system with a piezoelectric element for controlling the amount of injected fuel, comprises a control unit for determination of a possible fault of the piezoelectric element or of an electric circuitry driving the piezoelectric element based upon a value related to the capacitance of the piezoelectric element. This provides for a very effective diagnosis of the piezoelectric element and/or the circuitry driving the piezoelectric element. The circuitry driving the piezoelectric element may comprise switches for selection of particular piezoelectric elements or the power stage. The present invention is preferably used for detecting faults, in particular shortcuts in switches for selecting particular piezoelectric elements. Especially if there is a defective cylinder selecting switch the corresponding piezoelectric element would charge every time in parallel to another piezoelectric element so that a cylinder, corresponding to that defective cylinder selecting switch is filled with such a large amount of fuel that serious damage to the engine could occur. If there is a shortcut in the connection between power stage and the piezoelectric element similar serious problems might occur.

In a preferred embodiment of the invention the fuel injection system comprises at least two piezoelectric elements for controlling the amount of injected fuel, wherein the control unit is able to determine a possible fault of at least one of the piezoelectric elements or the electric circuitry driving the piezoelectric elements based upon on values related to the capacitances of the at least two piezoelectric elements.

In a further preferred embodiment of the invention the piezoelectric element is charged from a first voltage to a second voltage, wherein the control unit determines the value related to the capacitance of the piezoelectric element based upon the first voltage and the second voltage.

In a further preferred embodiment of the invention the piezoelectric element is charged from a first voltage to a second voltage with in a charging time, wherein the control unit determines the value related to the capacitance of the piezoelectric element based upon the charging time, and, in particular an estimated value of, a current charging the piezoelectric element. In a further embodiment of the invention the value related to the capacitance of the piezoelectric element is the difference between the first voltage and the second voltage or a function of that difference if charging time and charging current are kept essentially constant (with respect to the time instances the values related to the capacitance is calculated for or with respect to different piezoelectric elements). In a further embodiment of the invention the value related to the capacitance of the piezoelectric element is the charging time or a function of the charging time, if the difference between the first voltage and the second voltage and the current charging the piezoelectric element are kept essentially constant (with respect to the time instances the values related to the capacitance is calculated for or with respect to different piezoelectric elements). In a further embodiment of the invention the value related to the capacitance of the piezoelectric element is the current charging the piezoelectric element or a function of the current if the difference between the first voltage and the second voltage and the charging time are kept essentially constant (with respect to the time instances the values related to the capacitance is calculated for or with respect to different piezoelectric elements).

In a further preferred embodiment of the invention the control unit determines the value related to the capacitance of the piezoelectric element based upon the charge the piezoelectric element is carrying. In a possible embodiment of the invention the value related to the capacitance of the piezoelectric element is the charge the piezoelectric element is carrying or a function of this charge if the (first, second, third) voltage is kept essentially constant (with respect to the time instances the values related to the capacitance is calculated for or with respect to different piezoelectric elements).

In a further preferred embodiment of the invention the control unit determines the value related to the capacitance of the piezoelectric element based upon the quotient of the second voltage and the charge the piezoelectric element is carrying, based upon the quotient of the charge the piezoelectric element is carrying and the second voltage, based upon the quotient of the difference between the second voltage and the first voltage and the product of the charging time and the current charging the piezoelectric element, or based upon the quotient of the product of the charging time and the current charging the piezoelectric element and the difference between the second voltage and the first voltage. If one of the quantities charging time, current charging the piezoelectric element or difference between second voltage and the first voltage is kept essentially constant (with respect to the time instances the values related to the capacitance is calculated for or with respect to different piezoelectric elements), it can be replaced by one or another constant value.

In a further preferred embodiment of the invention the piezoelectric element is discharged from a second voltage to a third voltage, wherein the control unit determines the value related to the capacitance of the piezoelectric element based upon the second voltage and the third voltage.

In a further preferred embodiment of the invention the piezoelectric element is discharged from a second voltage to a third voltage within a discharging time, wherein within a discharging time the control unit determines the value related to the capacitance of the piezoelectric element based upon the discharging time, and, in particular an estimated value of, a current discharging the piezoelectric element. In a further embodiment of the invention the value related to the capacitance of the piezoelectric element is the difference between the third voltage and the second voltage or a function of that difference if charging time and charging current are kept essentially constant (with respect to the time instances the values related to the capacitance is calculated for or with respect to different piezoelectric elements). In a further embodiment of the invention the value related to the capacitance of the piezoelectric element is the discharging time or a function of the discharging time, if the difference between the third voltage and the second voltage and the current discharging the piezoelectric element are kept essentially constant (with respect to the time instances the values related to the capacitance is calculated for or with respect to different piezoelectric elements). In a further embodiment of the invention the value related to the capacitance of the piezoelectric element is the current discharging the piezoelectric element or a function of the current if the difference between the third voltage and the second voltage and the discharging time are kept essentially constant (with respect to the time instances the values related to the capacitance is calculated for or with respect to different piezoelectric elements).

In a further preferred embodiment of the invention the control unit determines the value related to the capacitance of the piezoelectric element based upon the quotient of the third voltage and the charge the piezoelectric element is carrying, based upon the quotient of the charge the piezoelectric element is carrying and the third voltage, based upon the quotient of the difference between the second voltage and the third voltage and the product of the discharging time and the current discharging the piezoelectric element, or based upon the quotient of the product of the discharging time and the current discharging the piezoelectric element and the difference between the second voltage and the third voltage. If one of the quantities charging time, current charging the piezoelectric element or difference between second voltage and the first voltage is kept essentially constant (with respect to the time instances the values related to the capacitance is calculated for or with respect to different piezoelectric elements), it can be replaced by one or another constant value.

In a further embodiment of the invention the third voltage equals the first voltage.

In a further preferred embodiment of the invention the control unit is able to determine a possible fault of the piezoelectric element or electric circuitry driving the piezoelectric element based upon a calculated value of the capacitance of the piezoelectric element and a value related to the capacitance of the piezoelectric element at a former stage, in particular based upon a comparison of the value related to the capacitance of the piezoelectric element and a former value related to the capacitance of the piezoelectric element.

In a further preferred embodiment of the invention the fuel injection system according to one of the foregoing claims wherein the fuel injection system comprises a switch (11, 21, 31, 41, 51 or 61) for discharging the piezoelectric element, wherein the control unit is able to determine a possible short cut of the switch (11, 21, 31, 41, 51 or 61) based upon the value related to the capacitance of the piezoelectric element.

The invention will be explained below in more detail with reference to exemplary embodiments, referring to the figures in which.

Figure 1:
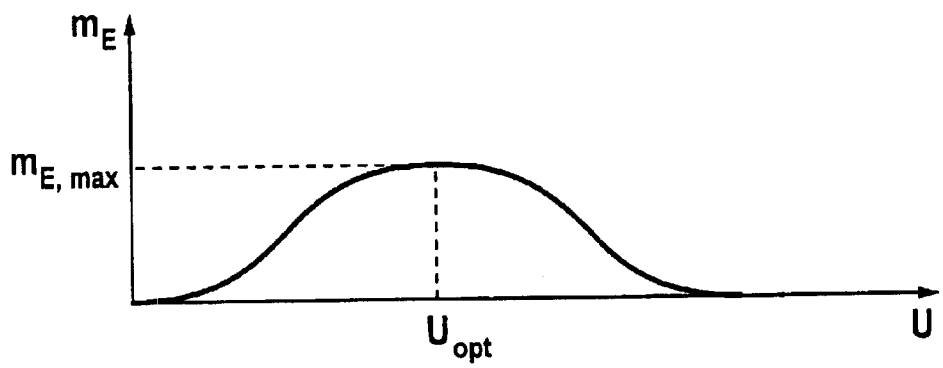
FIG. 1 shows a graph depicting the relationship between activation voltage and injected fuel volume in a fixed time period for the example of a double acting control valve.

FIG. 1 shows a graph depicting the relationship between activation voltage U and injected fuel volume $m_E$ during a preselected fixed time period, for an exemplary fuel injection system using piezoelectric elements acting upon double seat control valves. The y-axis represents volume $m_E$ of fuel injected into a cylinder chamber during the preselected fixed period of time. The x-axis represents the activation voltage U applied to or stored in the corresponding piezoelectric element, used to displace a valve plug of the double seat control valve.

At x=0, y=0, the activation voltage U is zero, and the valve plug is seated in a first closed position to prevent the flow of fuel during the preselected fixed period of time. For values of the activation voltage U greater than zero, up to the x-axis point indicated as $U_{opt}$, the represented values of the activation voltage U cause the displacement of the valve plug away from the first seat and towards the second seat, in a manner that results in a greater volume $m_E$ of injected fuel for the fixed time period, as the activation voltage U approaches $U_{opt}$, up to the value for volume indicted on the y-axis by $m_{E,max}$. The point $m_{E,max}$, corresponding to the greatest volume for the injected fuel during the fixed period of time, represents the value of the activation voltage for application to or charging of the piezoelectric element, that results in an optimal displacement of the valve plug between the first and second valve seats.

As shown on the graph of FIG. 1, for values of the activation voltage U greater than $U_{opt}$, the volume $m_E$ of fuel injected during the fixed period of time decrease until it reaches zero. This represents displacement of the valve plug from the optimal point and toward the second seat of the double seat valve until the valve plug is seated against the second valve seat. Thus, the graph of FIG. 1 illustrates that a maximum volume of fuel injection occurs when the activation voltage causes the piezoelectric element to displace the valve plug to the optimal point.

Figure 2:
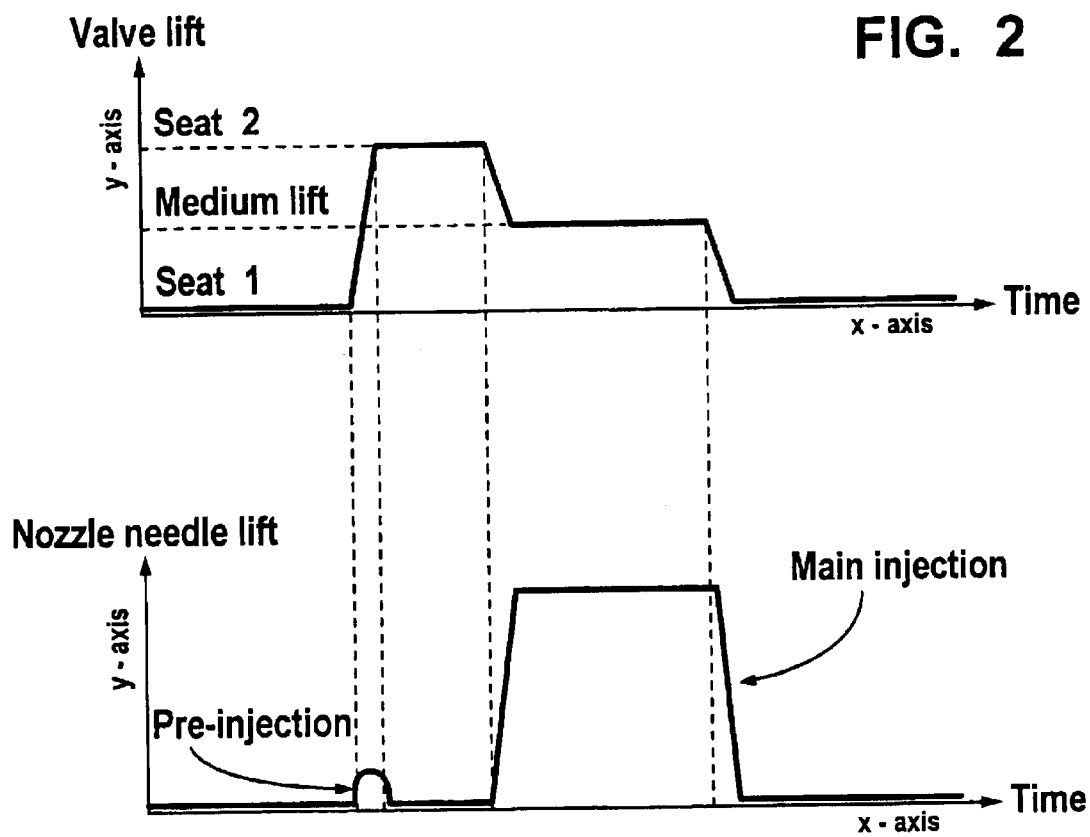
FIG. 2 shows a schematic profile of an exemplary control valve stroke and a corresponding nozzle needle lift for the example of a double acting control valve.

FIG. 2 shows a double graph representing a schematic profile of an exemplary control valve stroke, to illustrate the double seat valve operation discussed above. In the upper graph of FIG. 2, the x-axis represents time, and the y-axis represents displacement of the valve plug (valve lift). In the lower graph of FIG. 2, the x-axis once again represents time, while the y-axis represents a nozzle needle lift to provide fuel flow, resulting from the valve lift of the upper graph. The upper and lower graphs are aligned with one another to coincide in time, as represented by the respective x-axises.

During an injection cycle, the piezoelectric element is charged resulting in an expansion of the piezoelectric element, as will be described in greater detail, and causing the corresponding valve plug to move from the first seat to the second seat for a pre-injection stroke, as shown in the upper graph of FIG. 2. The lower graph of FIG. 2 shows a small injection of fuel that occurs as the valve plug moves between the two seats of the double seat valve, opening and closing the valve as the plug moves between the seats. In general, the charging of the piezoelectric element can be done in two steps: the first one is to charge it to a certain voltage and cause the valve to open and the second one is to charge it further and cause the valve to close again at the second seat. Between these steps, in general, there can be a certain time delay.

After a preselected period of time, a discharging operation is then performed, as will be explained in greater detail below, to reduce the charge within the piezoelectric element so that it contracts, as will also be described in greater detail, causing the valve plug to move away from the second seat, and hold at a midway point between the two seats. As indicated in FIG. 1, the activation voltage within the piezoelectric element is to reach a value that equals $U_{opt}$ to correspond to an optimal point of the valve lift, and thereby obtain a maximum fuel flow, $m_{E,max}$, during the period of time allocated to a main injection. The upper and lower graphs of FIG. 2 show the holding of the valve lift at a midway point, resulting in a main fuel injection.

At the end of the period of time for the main injection, the piezoelectric element is discharged to an activation voltage of zero, resulting in further contraction of the piezoelectric element, to cause the valve plug to move away from the optimal position, towards the first seat, closing the valve and stopping fuel flow, as shown in the upper and lower graphs of FIG. 2. At this time, the valve plug will once again be in a position to repeat another pre-injection, main injection cycle, as just described above, for example. Of course, any other injection cycle can be performed.

Figure 3:
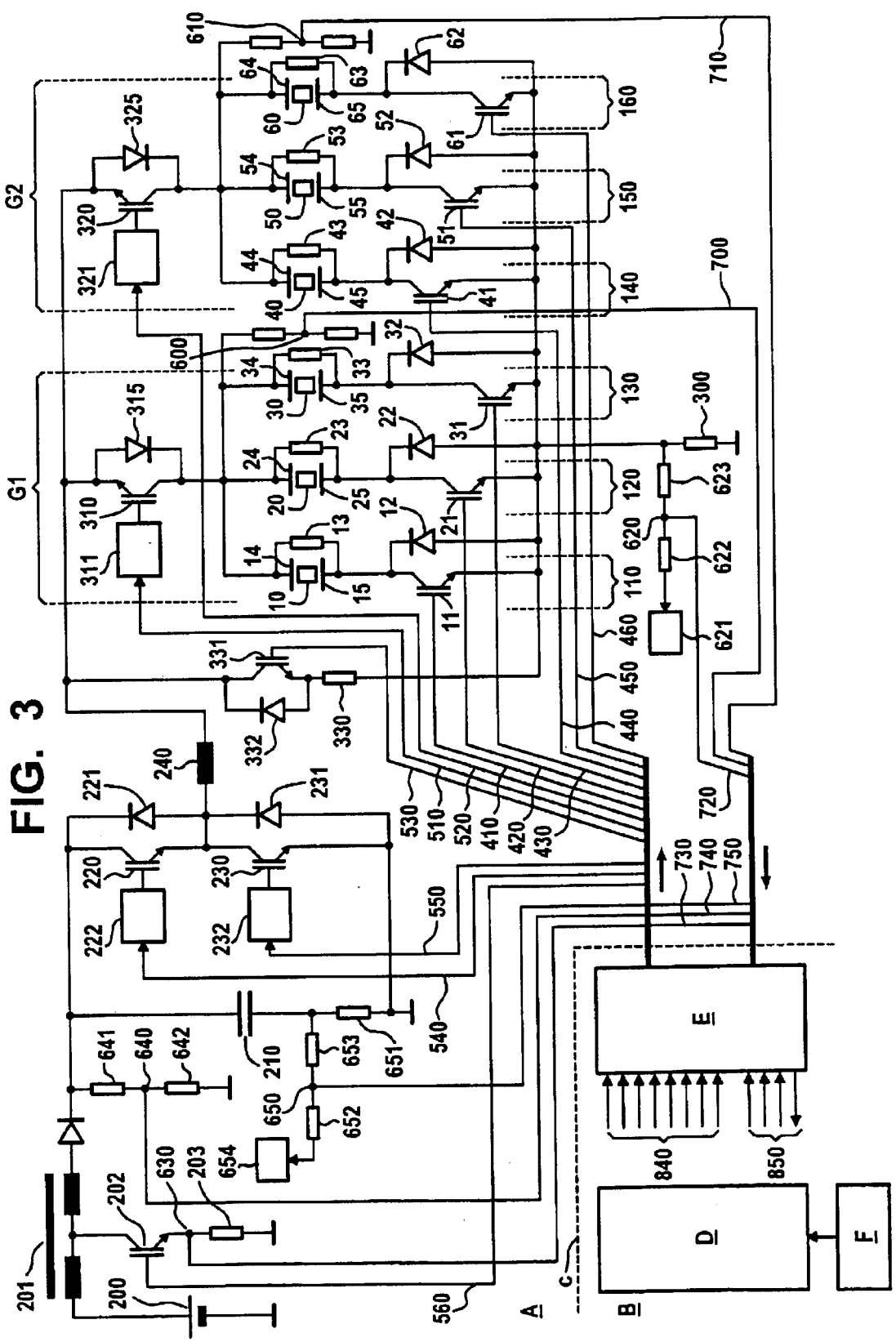
FIG. 3 shows a block diagram of an exemplary embodiment of an arrangement in which the present invention may be implemented.

FIG. 3 provides a block diagram of an exemplary embodiment of an arrangement in which the present invention may be implemented.

In FIG. 3 there is a detailed area A and a non-detailed area B, the separation of which is indicated by a dashed line c. The detailed area A comprises a circuit for charging and discharging piezoelectric elements 10, 20, 30, 40, 50 and 60. In the example being considered these piezoelectric elements 10, 20, 30, 40, 50 and 60 are actuators in fuel injection nozzles (in particular in so-called common rail injectors) of an internal combustion engine. Piezoelectric elements can be used for such purposes because, as is known, and as discussed above, they possess the property of contracting or expanding as a function of a voltage applied thereto or occurring therein. The reason to take six piezoelectric elements 10, 20, 30, 40, 50 and 60 in the embodiment described is to independently control six cylinders within a combustion engine; hence, any other number of piezoelectric elements might match any other purpose.

The non-detailed area B comprises a control unit D and a activation IC E by both of which the elements within the detailed area A are controlled, as well as a measuring system F for measuring system operating characteristics such as, for example, fuel pressure and rotational speed (rpm) of the internal combustion engine for input to and use by the control unit D, according to the present invention, as will be described in detail below. According to the present invention, the control unit D and activation IC E are programmed to control activation voltages for piezoelectric elements as a function of operating characteristics of the each particular piezoelectric element.

The following description firstly introduces the individual elements within the detailed area A. Then, the procedures of charging and discharging piezoelectric elements 10, 20, 30, 40, 50, 60 are described in general. Finally, the ways both procedures are controlled by means of control unit D and activation IC E, according to the present invention, are described in detail.

The circuit within the detailed area A comprises six piezoelectric elements 10, 20, 30, 40, 50 and 60.

The piezoelectric elements 10, 20, 30, 40, 50 and 60 are distributed into a first group G1 and a second group G2, each comprising three piezoelectric elements (i.e. piezoelectric elements 10, 20 and 30 in the first group G1 resp. 40, 50 and 60 in the second group G2). Groups G1 and G2 are constituents of circuit parts connected in parallel with one another. Group selector switches 310, 320 can be used to establish which of the groups G1, G2 of piezoelectric elements 10, 20 and 30 resp. 40, 50 and 60 will be discharged in each case by a common charging and discharging apparatus (however, the group selector switches 310, 320 are meaningless for charging procedures, as is explained in further detail below).

The group selector switches 310, 320 are arranged between a coil 240 and the respective groups G1 and G2 (the coil-side terminals thereof) and are implemented as transistors. Side drivers 311, 321 are implemented which transform control signals received from the activation IC E into voltages which are eligible for closing and opening the switches as required.

Diodes 315 and 325 (referred to as group selector diodes) respectively, are provided in parallel with the group selector switches 310, 320. If the group selector switches 310, 320 are implemented as MOSFETs, these group selector diodes 315 and 325 can be constituted by the parasitic diodes themselves. The diodes 315, 325 bypass the group selector switches 310, 320 during charging procedures. Hence, the functionality of the group selector switches 310, 320 is reduced to select a group G1, G2 of piezoelectric elements 10, 20 and 30, resp. 40, 50 and 60 for a discharging procedure only.

Within each group G1 resp. G2 the piezoelectric elements 10, 20 and 30, resp. 40, 50 and 60 are arranged as constituents of piezoelectric branches 110, 120 and 130 (group G1) and 140, 150 and 160 (group G2) that are connected in parallel. Each piezoelectric branch comprises a series circuit made up of a first parallel circuit comprising a piezoelectric element 10, 20, 30, 40, 50 resp. 60 and a resistor 13, 23, 33, 43, 53 resp. 63 (referred to as branch resistors) and a second parallel circuit made up of a selector switch implemented as a transistor 11, 21, 31, 41, 51 resp. 61 (referred to as branch selector switches) and a diode 12, 22, 32, 42, 52 resp. 62 (referred to as branch diodes).

The branch resistors 13, 23, 33, 43, 53 resp. 63 cause each corresponding piezoelectric element 10, 20, 30, 40, 50 resp. 60 during and after a charging procedure to continuously discharge themselves, since they connect both terminals of each capacitive piezoelectric element 10, 20, 30, 40, 50, resp. 60 one to another. However, the branch resistors 13, 23, 33, 43, 53 resp. 63 are sufficiently large to make this procedure slow compared to the controlled charging and discharging procedures as described below. Hence, it is still a reasonable assumption to consider the charge of any piezoelectric element 10, 20, 30, 40, 50 or 60 as unchanging within a relevant time after a charging procedure (the reason to nevertheless implement the branch resistors 13, 23, 33, 43, 53 and 63 is to avoid remaining charges on the piezoelectric elements 10, 20, 30, 40, 50 and 60 in case of a breakdown of the system or other exceptional situations). Hence, the branch resistors 13, 23, 33, 43, 53 and 63 may be neglected in the following description.

The branch selector switch/branch diode pairs in the individual piezoelectric branches 110, 120, 130, 140, 150 resp. 160, i.e. selector switch 11 and diode 12 in piezoelectric branch 110, selector switch 21 and diode 22 in piezoelectric branch 120, and so on, can be implemented using electronic switches (i.e. transistors) with parasitic diodes, for example MOSFETs or IGBTs (as stated above for the group selector switch/diode pairs 310 and 315 resp. 320 and 325).

The branch selector switches 11, 21, 31, 41, 51 resp. 61 can be used to establish which of the piezoelectric elements 10, 20, 30, 40, 50 or 60 will be charged in each case by a common charging and discharging apparatus: in each case, the piezoelectric elements 10, 20, 30, 40, 50 or 60 that are charged are all those whose branch selector switches 11, 21, 31, 41, 51 or 61 are closed during the charging procedure which is described below. Usually, at any time only one of the branch selector switches is closed.

The branch diodes 12, 22, 32, 42, 52 and 62 serve for bypassing the branch selector switches 11, 21, 31, 41, 51 resp. 61 during discharging procedures. Hence, in the example considered for charging procedures any individual piezoelectric element can be selected, whereas for discharging procedures either the first group G1 or the second group G2 of piezoelectric elements 10, 20 and 30 resp. 40, 50 and 60 or both have to be selected.

Returning to the piezoelectric elements 10, 20, 30, 40, 50 and 60 themselves, the branch selector piezoelectric terminals 15, 25, 35, 45, 55 resp. 65 may be connected to ground either through the branch selector switches 11, 21, 31, 41, 51 resp. 61 or through the corresponding diodes 12, 22, 32, 42, 52 resp. 62 and in both cases additionally through resistor 300.

The purpose of resistor 300 is to measure the currents that flow during charging and discharging of the piezoelectric elements 10, 20, 30, 40, 50 and 60 between the branch selector piezoelectric terminals 15, 25, 35, 45, 55 resp. 65 and the ground. A knowledge of these currents allows a controlled charging and discharging of the piezoelectric elements 10, 20, 30, 40, 50 and 60. In particular, by closing and opening charging switch 220 and discharging switch 230 in a manner dependent on the magnitude of the currents, it is possible to set the charging current and discharging current to predefined average values and/or to keep them from exceeding or falling below predefined maximum and/ or minimum values as is explained in further detail below.

In the example considered, the measurement itself further requires a voltage source 621 which supplies a voltage of 5 V DC, for example, and a voltage divider implemented as two resistors 622 and 623. This is in order to prevent the activation IC E (by which the measurements are performed) from negative voltages which might otherwise occur on measuring point 620 and which cannot be handled by means of activation IC E: such negative voltages are changed into positive voltages by means of addition with a positive voltage setup which is supplied by voltage source 621 and voltage divider resistors 622 and 623.

The other terminal of each piezoelectric element 10, 20, 30, 40, 50 and 60, i.e. the group selector piezoelectric terminal 14, 24, 34, 44, 54 resp. 64, may be connected to the plus pole of a voltage source via the group selector switch 310 resp. 320 or via the group selector diode 315 resp. 325 as well as via a coil 240 and a parallel circuit made up of a charging switch 220 and a charging diode 221, and alternatively or additionally connected to ground via the group selector switch 310 resp. 320 or via diode 315 resp. 325 as well as via the coil 240 and a parallel circuit made up of a discharging switch 230 or a discharging diode 231. Charging switch 220 and discharging switch 230 are implemented as transistors, for example, which are controlled via side drivers 222 resp. 232.

The voltage source comprises an element having capacitive properties which, in the example being considered, is the (buffer) capacitor 210. Capacitor 210 is charged by a battery 200 (for example a motor vehicle battery) and a DC voltage converter 201 downstream therefrom. DC voltage converter 201 converts the battery voltage (for example, 12 V) into substantially any other DC voltage (for example 250 V), and charges capacitor 210 to that voltage. DC voltage converter 201 is controlled by means of transistor switch 202 and resistor 203 which is utilized for current measurements taken from a measuring point 630.

For cross check purposes, a further current measurement at a measuring point 650 is allowed by activation IC E as well as by resistors 651, 652 and 653 and a 5 V DC voltage, for example, source 654; moreover, a voltage measurement at a measuring point 640 is allowed by activation IC E as well as by voltage dividing resistors 641 and 642.

Finally, a resistor 330 (referred to as total discharging resistor), a stop switch implemented as a transistor 331 (referred to as stop switch), and a diode 332 (referred to as total discharging diode) serve to discharge the piezoelectric elements 10, 20, 30, 40, 50 and 60 (if they happen to be not discharged by the "normal" discharging operation as described further below). Stop switch 331 is preferably closed after "normal" discharging procedures (cycled discharging via discharge switch 230). It thereby connects piezoelectric elements 10, 20, 30, 40, 50 and 60 to ground through resistors 330 and 300, and thus removes any residual charges that might remain in piezoelectric elements 10, 20, 30, 40, 50 and 60. The total discharging diode 332 prevents negative voltages from occurring at the piezoelectric elements 10, 20, 30, 40, 50 and 60, which might in some circumstances be damaged thereby.

Charging and discharging of all the piezoelectric elements 10, 20, 30, 40, 50 and 60 or any particular one is accomplished by way of a single charging and discharging apparatus (common to all the groups and their piezoelectric elements). In the example being considered, the common charging and discharging apparatus comprises battery 200, DC voltage converter 201, capacitor 210, charging switch 220 and discharging switch 230, charging diode 221 and discharging diode 231 and coil 240.

The charging and discharging of each piezoelectric element works the same way and is explained in the following while referring to the first piezoelectric element 10 only.

Figure 4A:
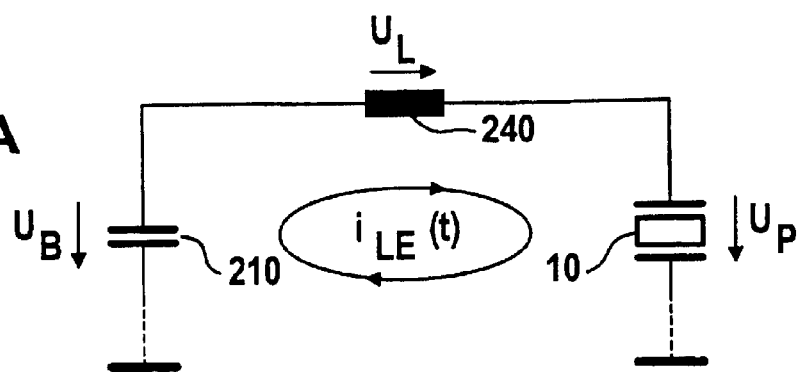
FIG. 4A shows a depiction to explain the conditions occurring during a first charging phase (charging switch 220 closed) in the circuit of FIG. 3.
Figure 4B:
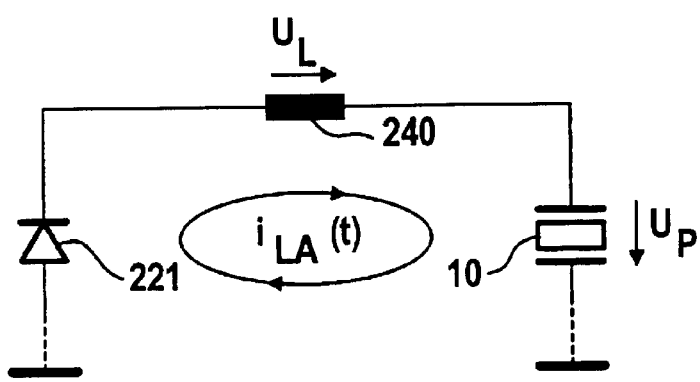
FIG. 4B shows a depiction to explain the conditions occurring during a second charging phase (charging switch 220 open again) in the circuit of FIG. 3.

The conditions occurring during the charging and discharging procedures are explained with reference to FIGS. 4A through 4D, of which FIGS. 4A and 4B illustrate the charging of piezoelectric element 10, and FIGS. 4C and 4D the discharging of piezoelectric element 10.

The selection of one or more particular piezoelectric elements 10, 20, 30, 40, 50 or 60 to be charged or discharged, the charging procedure as described in the following as well as the discharging procedure are driven by activation IC E and control unit D by means of opening or closing one or more of the above introduced switches 11, 21, 31, 41, 51, 61; 310, 320; 220, 230 and 331. The interactions between the elements within the detailed area A on the one hand and activation IC E and control unit D on the other hand are described in detail further below.

Concerning the charging procedure, firstly any particular piezoelectric element 10, 20, 30, 40, 50 or 60 which is to be charged has to be selected. In order to exclusively charge the first piezoelectric element 10, the branch selector switch 11 of the first branch 110 is closed, whereas all other branch selector switches 21, 31, 41, 51 and 61 remain opened. In order to exclusively charge any other piezoelectric element 20, 30, 40, 50, 60 or in order to charge several ones at the same time they would be selected by closing the corresponding branch selector switches 21, 31, 41, 51 and/or 61. Then, the charging procedure itself may take place:

Generally, within the example considered, the charging procedure requires a positive potential difference between capacitor 210 and the group selector piezoelectric terminal 14 of the first piezoelectric element 10. However, as long as charging switch 220 and discharging switch 230 are open no charging or discharging of piezoelectric element 10 occurs: In this state, the circuit shown in FIG. 3 is in a steady-state condition, i.e. piezoelectric element 10 retains its charge state in substantially unchanged fashion, and no currents flow.

In order to charge the first piezoelectric element 10, charging switch 220 is closed. Theoretically, the first piezoelectric element 10 could become charged just by doing so. However, this would produce large currents which might damage the elements involved. Therefore, the occurring currents are measured at measuring point 620 and switch 220 is opened again as soon as the detected currents exceed a certain limit. Hence, in order to achieve any desired charge on the first piezoelectric element 10, charging switch 220 is repeatedly closed and opened whereas discharging switch 230 remains open.

In more detail, when charging switch 220 is closed, the conditions shown in FIG. 4A occur, i.e. a closed circuit comprising a series circuit made up of piezoelectric element 10, capacitor 210, and coil 240 is formed, in which a current $i_{LE}(t)$ flows as indicated by arrows in FIG. 4A. As a result of this current flow both positive charges are brought to the group selector piezoelectric terminal 14 of the first piezoelectric element 10 and energy is stored in coil 240.

When charging switch 220 opens shortly (for example, a few $\mu s$) after it has closed, the conditions shown in FIG. 4B occur: a closed circuit comprising a series circuit made up of piezoelectric element 10, charging diode 221, and coil 240 is formed, in which a current $i_{LA}(t)$ flows as indicated by arrows in FIG. 4B. The result of this current flow is that energy stored in coil 240 flows into piezoelectric element 10. Corresponding to the energy delivery to the piezoelectric element 10, the voltage occurring in the latter, and its external dimensions, increase. Once energy transport has taken place from coil 240 to piezoelectric element 10, the steady-state condition of the circuit, as shown in FIG. 3 and already described, is once again attained.

At that time, or earlier, or later (depending on the desired time profile of the charging operation), charging switch 220 is once again closed and opened again, so that the processes described above are repeated. As a result of the re-closing and re-opening of charging switch 220, the energy stored in piezoelectric element 10 increases (the energy already stored in the piezoelectric element 10 and the newly delivered energy are added together), and the voltage occurring at the piezoelectric element 10, and its external dimensions, accordingly increase.

If the aforementioned closing and opening of charging switch 220 are repeated numerous times, the voltage occurring at the piezoelectric element 10, and the expansion of the piezoelectric element 10, rise in steps.

Once charging switch 220 has closed and opened a predefined number of times, and/or once piezoelectric element 10 has reached the desired charge state, charging of the piezoelectric element is terminated by leaving charging switch 220 open.

Concerning the discharging procedure, in the example considered, the piezoelectric elements 10, 20, 30, 40, 50 and 60 are discharged in groups (G1 and/or G2) as follows:

Firstly, the group selector switch(es) 310 and/or 320 of the group or groups G1 and/or G2 the piezoelectric elements of which are to be discharged are closed (the branch selector switches 11, 21, 31, 41, 51, 61 do not affect the selection of piezoelectric elements 10, 20, 30, 40, 50, 60 for the discharging procedure, since in this case they are bypassed by the branch diodes 12, 22, 32, 42, 52 and 62). Hence, in order to discharge piezoelectric element 10 as a part of the first group G1, the first group selector switch 310 is closed.

Figure 4C:
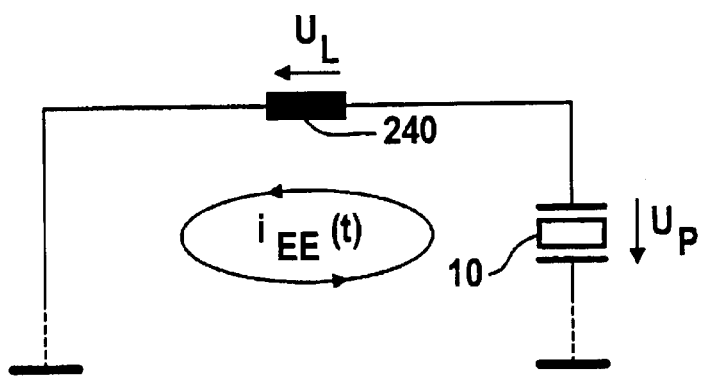
FIG. 4C shows a depiction to explain the conditions occurring during a first discharging phase (discharging switch 230 closed) in the circuit of FIG. 3.

When discharging switch 230 is closed, the conditions shown in FIG. 4C occur: a closed circuit comprising a series circuit made up of piezoelectric element 10 and coil 240 is formed, in which a current $i_{EE}(t)$ flows as indicated by arrows in FIG. 4C. The result of this current flow is that the energy (a portion thereof) stored in the piezoelectric element is transported into coil 240. Corresponding to the energy transfer from piezoelectric element 10 to coil 240, the voltage occurring at the piezoelectric element 10, and its external dimensions, decrease.

Figure 4D:
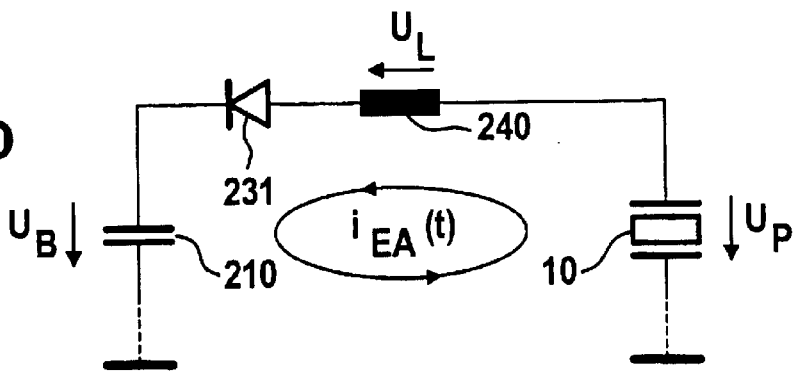
FIG. 4D shows a depiction to explain the conditions occurring during a second discharging phase (discharging switch 230 open again) in the circuit of FIG. 3.

When discharging switch 230 opens shortly (for example, a few μs) after it has closed, the conditions shown in FIG. 4D occur: a closed circuit comprising a series circuit made up of piezoelectric element 10, capacitor 210, discharging diode 231, and coil 240 is formed, in which a current $i_{EA}(t)$ flows as indicated by arrows in FIG. 4D. The result of this current flow is that energy stored in coil 240 is fed back into capacitor 210. Once energy transport has taken place from coil 240 to capacitor 210, the steady-state condition of the circuit, as shown in FIG. 3 and already described, is once again attained.

At that time, or earlier, or later (depending on the desired time profile of the discharging operation), discharging switch 230 is once again closed and opened again, so that the processes described above are repeated. As a result of the re-closing and re-opening of discharging switch 230, the energy stored in piezoelectric element 10 decreases further, and the voltage occurring at the piezoelectric element, and its external dimensions, also accordingly decrease.

If the aforementioned closing and opening of discharging switch 230 are repeated numerous times, the voltage occurring at the piezoelectric element 10, and the expansion of the piezoelectric element 10, decrease in steps.

Once discharging switch 230 has closed and opened a predefined number of times, and/or once the piezoelectric element has reached the desired discharge state, discharging of the piezoelectric element 10 is terminated by leaving discharging switch 230 open.

The interaction between activation IC E and control unit D on the one hand and the elements within the detailed area A on the other hand is performed by control signals sent from activation IC E to elements within the detailed area A via branch selector control lines 410, 420, 430, 440, 450, 460, group selector control lines 510, 520, stop switch control line 530, charging switch control line 540 and discharging switch control line 550 and control line 560. On the other hand, there are sensor signals obtained on measuring points 600, 610, 620, 630, 640, 650 within the detailed area A which are transmitted to activation IC E via sensor lines 700, 710, 720, 730, 740, 750.

The control lines are used to apply or not to apply voltages to the transistor bases in order to select piezoelectric elements 10, 20, 30, 40, 50 or 60, to perform charging or discharging procedures of single or several piezoelectric elements 10, 20, 30, 40, 50, 60 by means of opening and closing the corresponding switches as described above. The sensor signals are particularly used to determine the resulting voltage of the piezoelectric elements 10, 20 and 30, resp. 40, 50 and 60 from measuring points 600 resp. 610 and the charging and discharging currents from measuring point 620. The control unit D and the activation IC E are used to combine both kinds of signals in order to perform an interaction of both as will be described in detail now while referring to FIGS. 3 and 5.

As is indicated in FIG. 3, the control unit D and the activation IC E are connected to each other by means of a parallel bus 840 and additionally by means of a serial bus 850. The parallel bus 840 is particularly used for fast transmission of control signals from control unit D to the activation IC E, whereas the serial bus 850 is used for slower data transfer.

Figure 5:
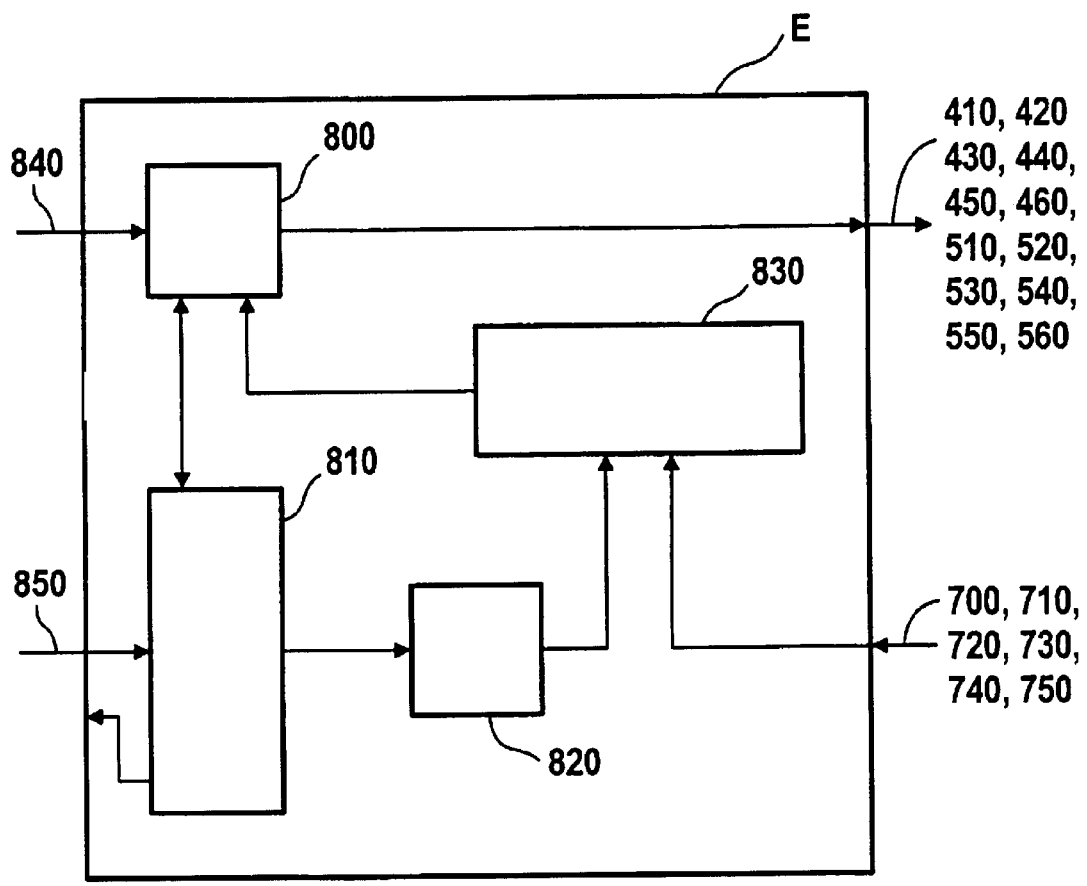
FIG. 5 shows a block diagram of components of the activation IC E which is also shown in FIG. 3.

In FIG. 5 some components are indicated, which the activation IC E comprises: a logic circuit 800, RAM memory 810, digital to analog converter system 820 and comparator system 830. Furthermore, it is indicated that the fast parallel bus 840 (used for control signals) is connected to the logic circuit 800 of the activation IC E, whereas the slower serial bus 850 is connected to the RAM memory 810. The logic circuit 800 is connected to the RAM memory 810, to the comparator system 830 and to the signal lines 410, 420, 430, 440, 450 and 460; 510 and 520; 530; 540, 550 and 560. The RAM memory 810 is connected to the logic circuit 800 as well as to the digital to analog converter system 820. The digital to analog converter system 820 is further connected to the comparator system 830. The comparator system 830 is further connected to the sensor lines 700 and 710; 720; 730, 740 and 750 and—as already mentioned—to the logic circuit 800.

The above listed components may be used in a charging procedure for example as follows:

By means of the control unit D a particular piezoelectric element 10, 20, 30, 40, 50 or 60 is determined which is to be charged to a certain target voltage. Hence, firstly the value of the target voltage (expressed by a digital number) is transmitted to the RAM memory 810 via the slower serial bus 850. The target voltage can be, for example, the value for $U_{opt}$ used in a main injection, as described above with respect to FIG. 1. Later or simultaneously, a code corresponding to the particular piezoelectric element 10, 20, 30, 40, 50 or 60 which is to be selected and the address of the desired voltage within the RAM memory 810 is transmitted to the logic circuit 800 via the parallel bus 840. Later on, a strobe signal is sent to the logic circuit 800 via the parallel bus 840 which gives the start signal for the charging procedure.

The start signal firstly causes the logic circuit 800 to pick up the digital value of the target voltage from the RAM memory 810 and to put it on the digital to analog converter system 820 whereby at one analog exit of the converters 820 the desired voltage occurs. Moreover, said analog exit (not shown) is connected to the comparator system 830. In addition hereto, the logic circuit 800 selects either measuring point 600 (for any of the piezoelectric elements 10, 20 or 30 of the first group G1) or measuring point 610 (for any of the piezoelectric elements 40, 50 or 60 of the second group G2) to the comparator system 830. Resulting thereof, the target voltage and the present voltage at the selected piezoelectric element 10, 20, 30, 40, 50 or 60 are compared by the comparator system 830. The results of the comparison, i.e. the differences between the target voltage and the present voltage, are transmitted to the logic circuit 800.

Thereby, the logic circuit 800 can stop the procedure as soon as the target voltage and the present voltage are equal to one another.

Secondly, the logic circuit 800 applies a control signal to the branch selector switch 11, 21, 31, 41, 51 or 61 which corresponds to any selected piezoelectric element 10, 20, 30, 40, 50 or 60 so that the switch becomes closed (all branch selector switches 11, 21, 31, 41, 51 and 61 are considered to be in an open state before the onset of the charging procedure within the example described). Then, the logic circuit 800 applies a control signal to the charging switch 220 so that the switch becomes closed. Furthermore, the logic circuit 800 starts (or continues) measuring any currents occurring on measuring point 620. Hereto, the measured currents are compared to any predefined maximum value by the comparator system 830. As soon as the predefined maximum value is achieved by the detected currents, the logic circuit 800 causes the charging switch 220 to open again.

Again, the remaining currents at measuring point 620 are detected and compared to any predefined minimum value. As soon as said predefined minimum value is achieved, the logic circuit 800 causes the charging switch 220 to close again and the procedure starts once again.

The closing and opening of the charging switch 220 is repeated as long as the detected voltage at measuring point 600 or 610 is below the target voltage. As soon as the target voltage is achieved, the logic circuit stops the continuation of the procedure.

The discharging procedure takes place in a corresponding way: Now the selection of the piezoelectric element 10, 20, 30, 40, 50 or 60 is obtained by means of the group selector switches 310 resp. 320, the discharging switch 230 instead of the charging switch 220 is opened and closed and a predefined minimum target voltage is to be achieved.

The timing of the charging and discharging operations and the holding of voltage levels in the piezoelectric elements 10, 20, 30, 40, 50 or 60, as for example, the time of a main injection, can be according to a valve stroke, as shown, for example, in FIG. 2.

It is to be understood that the above given description of the way charging or discharging procedures take place are exemplary only. Hence, any other procedure which utilizes the above described circuits or other circuits might match any desired purpose and any corresponding procedure may be used in place of the above described example.

It is extremely important that the actuator travel be set with the highest accuracy possible. In this respect, a temperature dependence by the actuator travel has a decisive effect on the function of the entire common-rail injector. Temperature dependence of the actuator travel can be compensated by knowing the temperature dependence of its capacitance. In this process, the capacitance of a piezoelectric element is measured in the control unit and the temperature is determined by way of the capacitance-temperature relationship. This relationship could be established from laboratory measurement. Then during operation, the information in the capacitance-temperature relationship could be accessed to identify the temperature corresponding to the measured capacitance of the piezoelectric element.

Preferably the capacitances of all of the piezoelectric elements are measured and compared. If the value of the capacitance for one of the piezoelectric element deviates from the average value of all measured capacitances by more than a specific amount, that piezoelectric element can be identified as defective independent of temperature. An erroneous temperature compensation can thus be avoided when such a determination is made. In addition, if defective piezoelectric element is detected a warning signal for the driver can be provided.

The capacitance $C_i$ of each piezoelectric element is determined in specific time intervals (for example, i=1 to 4 for a four cylinder engine). The average capacitance $C_{avg}$ can then be calculated from these values, and a capacitance differential value, $C_i-C_{avg}$ can further be calculated. If the absolute capacitance differential value, $|C_i-C_{avg}|$, for a piezoelectric element exceeds a permissible capacitance limit $C\Delta$, that piezoelectric element can be classified as defective and that piezoelectric element would not be taken into account for making temperature compensations. As noted above, if the capacitance limit value of $C\Delta$ is exceeded, then a warning signal may be transmitted to the vehicle operator. Preferably the piezoelectric element which is identified as being defective.

Figure 6:
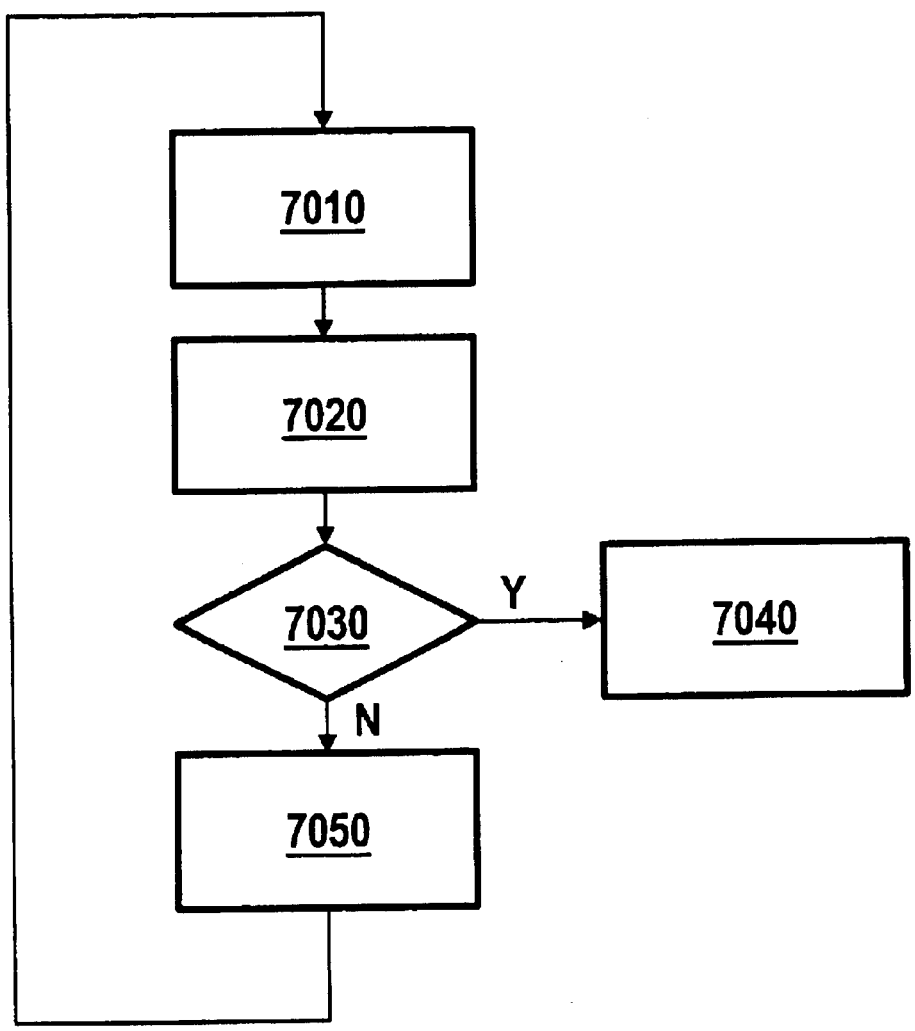
FIG. 6 shows a flow chart according to an embodiment of the present invention for detecting out of tolerance piezoelectric actuators.

FIG. 6 shows a flow chart according to one embodiment of the present invention for detecting out of tolerance piezoelectric elements. Referring to FIG. 6, step 7010 represents the measurement of the capacitance $C_i$ of all piezoelectric elements. In this step, the piezoelectric elements capacitance is obtained.

The value for the individual piezoelectric elements is then averaged in step 7020 obtaining an average capacitance $C_{avg}$. Step 7020 is followed by a decision block 7030, deciding whether $|C_i-C_{avg}|$ exceeds the permissible capacitance limit $C\Delta$. If the permissible capacitance limit $C\Delta$ is exceeded the piezoelectric element is classified as inoperable or defective and according to step 7040, an error message can be provided to notify the driver of such error. Step 7040 is an optional but preferred embodiment. If $|C_i-C_{avg}|$ is within the desired range, the entire procedure can be repeated after a given interval in step 7050.

Figure 7:
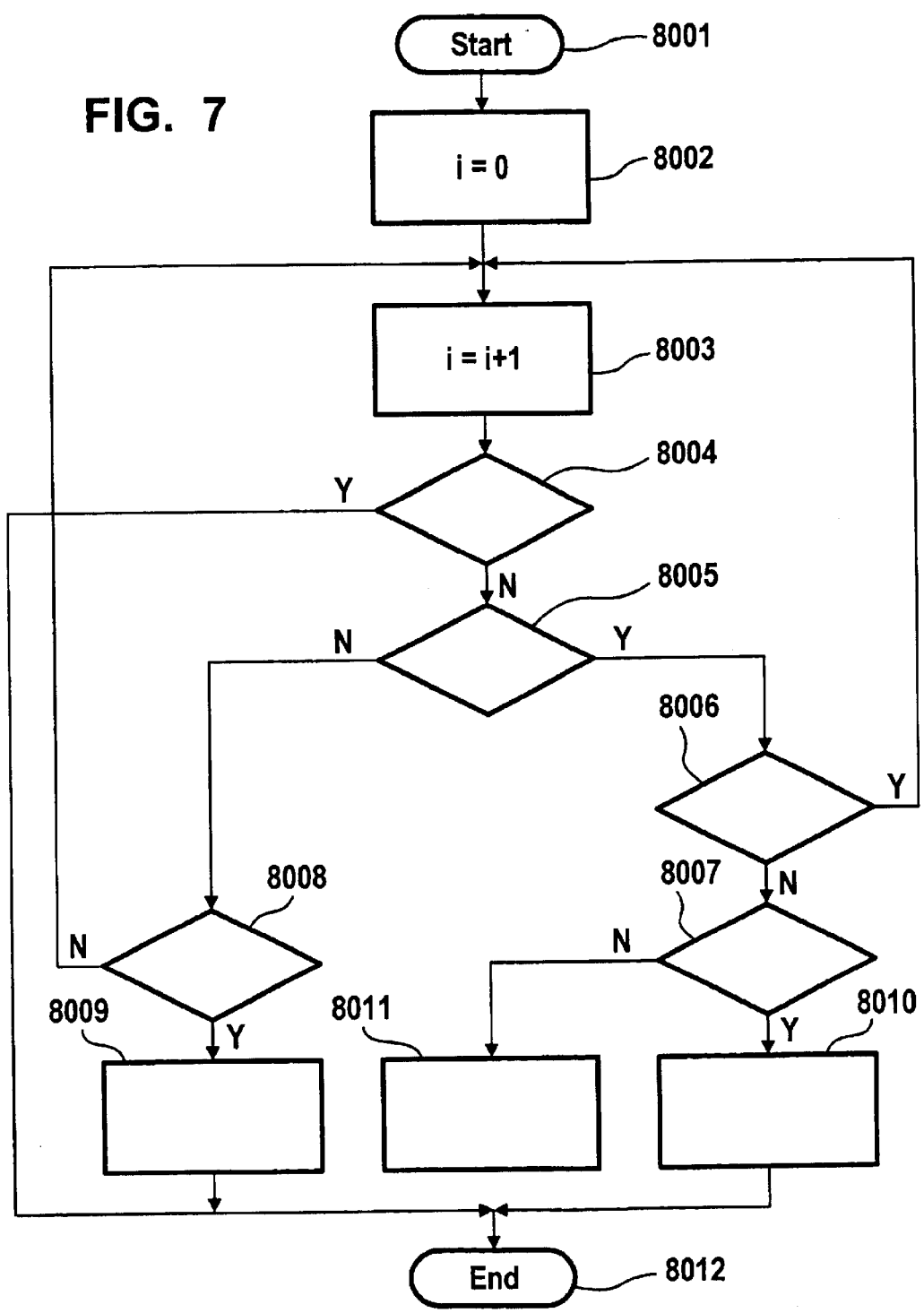
FIG. 7 shows a flow chart according to an embodiment of the present invention in particular for detecting defects of the power stage or of a cable supplying the voltage for driving a piezoelectric element of a fuel injector.
Figure 8:
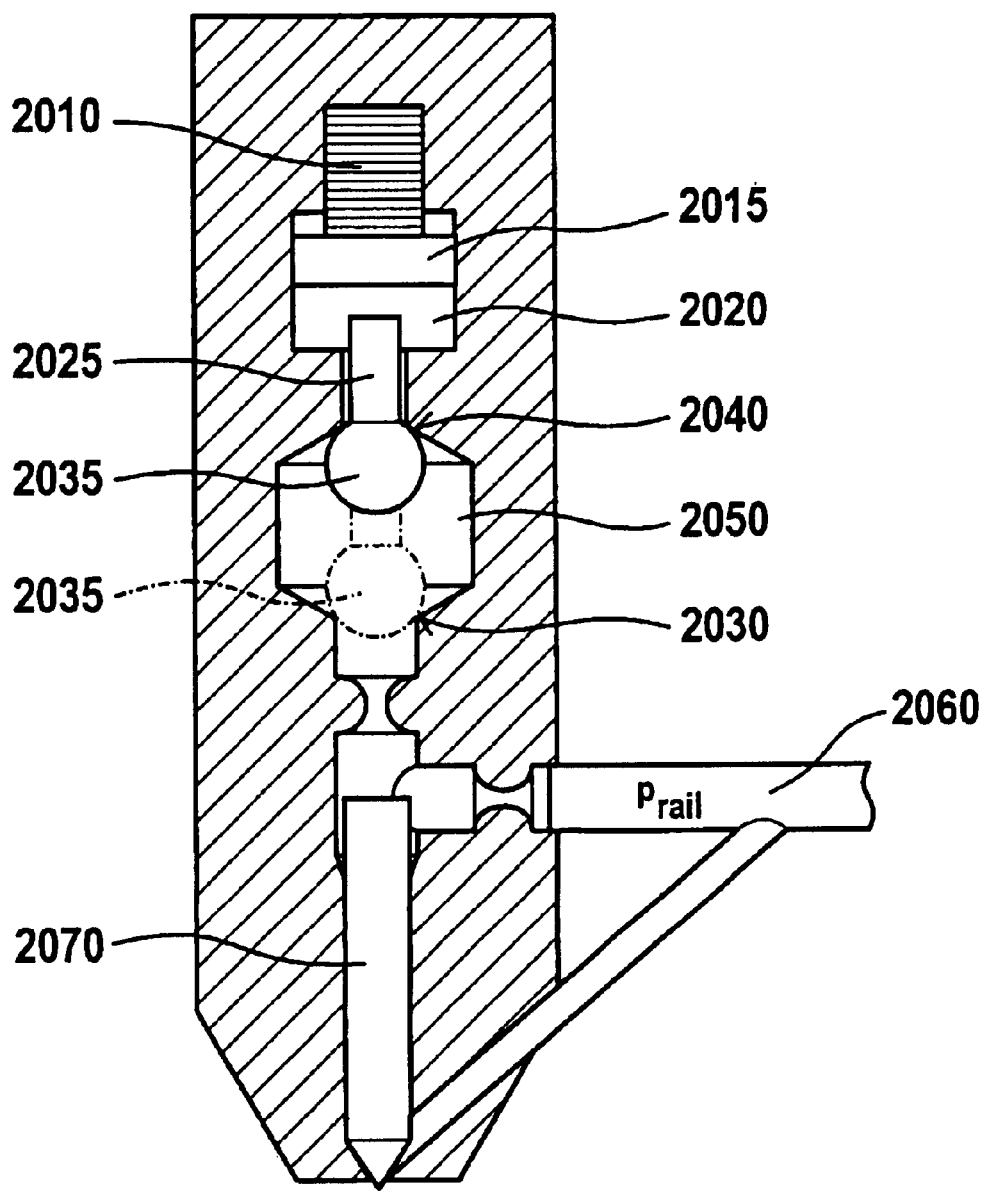
FIG. 8 shows a schematic representation of a fuel injection system using a piezoelectric element as an actuator.

FIG. 7 shows a flow chart to a preferred embodiment of the present invention in particular for detecting defects of the power stage or of a cable supplying the voltage for driving a piezoelectric element of a fuel injector. The start of the program 8001 is followed by an initialization of step 8002 where a counter i is set to 0:

i=0

The initialization step 8002 is followed by step 8003 incrementing i by 1:

i=i+1

Step 8003 is followed by decision block 8004 determining whether i>n wherein n is the number of cylinders. In this embodiment to every cylinder one fuel injector comprising one piezoelectric element is assigned too.

If i is greater than n the program is terminated, i.e. in this case decision block 8004 is followed by the end 8012. If this condition is not fulfilled decision block 8004 is followed by a decision block 8005 checking whether $$\frac{C_i}{C_{i+1}} \geq f_{min1}$$

wherein $C_i$ is the capacitance of the piezoelectric element controlling fuel injection into the $i^{th}$ cylinder and $C_{i+1}$ is the capacitance of the piezoelectric element controlling fuel injection into the $(i+1)^{th}$ cylinder. $f_{min1}$ is a tolerance value. $f_{min1}$ is preferably a value between 0,8 and 1, preferably in the range of 0,9. If the condition $$\frac{C_i}{C_{i+1}} \geq f_{min1}$$

is not met, decision block 8005 is followed by decision block 8008. If however the condition $$\frac{C_i}{C_{i+1}} \geq f_{min1}$$

is met, decision block 8005 is followed by decision block 8006.

With decision block 8008 it is determined whether the conditions $$\frac{C_i}{C_{i+1}} \geq f_{min0.5} \text{ and } \frac{C_i}{C_{i+1}} \geq f_{max0.5} \quad \frac{C_i}{C_{i+1}} \leq f_{max1}$$

is met wherein $f_{max1}$ is a tolerance value. Its value is preferably between 1 and 1,2 most preferably approximately 1,1.

If this condition is met decision block 8006 is followed by decision block 8003. If however this condition is not met, decision block 8006 is followed by decision block 8007.

Decision block 8007 determines whether the conditions $$\frac{C_i}{C_{i+1}} \geq f_{min2} \text{ and } \frac{C_i}{C_{i+1}} \leq f_{max2}$$

are met, wherein $f_{min2}$ is a tolerance value. Its value is preferably between 1,6 and 2,0 most preferably approximately 1,8. $f_{max2}$ is also a tolerance value Its value is preferably between 2, 0 and 2,4 most preferably approximately 2,2.

If one of the conditions $$\frac{C_i}{C_{i+1}} \geq f_{min2} \text{ and } \frac{C_i}{C_{i+1}} \leq f_{max2}$$

are met, wherein $f_{min0.5}$ is a tolerance value. Its value is preferably between 0,3 and 0,5 most preferably approximately 0,4. $f_{max0.5}$ is also a tolerance value. Its value is preferably between 0,5 and 0,7 most preferably approximately 0,6.

If either one of the conditions $$\frac{C_i}{C_{i+1}} \geq f_{min0.5} \text{ and } \frac{C_i}{C_{i+1}} \leq f_{max0.5}$$

is not met, decision block 8008 is followed by step 8003. If however both conditions $$\frac{C_i}{C_{i+1}} \geq f_{min0.5} \text{ and } \frac{C_i}{C_{i+1}} \leq f_{max0.5}$$

are met, decision block 8008 is followed by step 8009. Step 8009 defines the piezoelectric element controlling the fuel injection into cylinder i as being defective. Preferably an alarm is created and/or a failure message is recorded in a log. After step 8009 the program is terminated.

Decision block 8006 determines whether the condition is not met decision block 8007 is followed by a step 8011 defining that an undefined failure has occurred. Preferably an alarm is created and/or a failure message is recorded into a log.

If however both of the conditions $$\frac{C_i}{C_{i+1}} \geq f_{min2} \text{ and } \frac{C_i}{C_{i+1}} \leq f_{max2}$$

are met decision block 8007 is followed by a step 8010. Step 8010 defines the piezoelectric element controlling the fuel injection into cylinder i+1 as being defective. Preferably an alarm is created and/or a failure message is recorded in a log. After step 8010 the program is terminated.

It should be noted that FIG. 6 and FIG. 7 represent only embodiments of the claimed invention, and other methods for finding an inoperable piezoelectric element by comparing the piezoelectric elements capacitance with a predetermined set of values is contemplated as within the scope of the present invention. In FIG. 6 and FIG. 7 the capacitance of the piezoelectric element is used as one example of the value related to the capacitance of the piezoelectric element. The examples are also valid if the capacitance of the piezoelectric element is replaced by another example of the value related to the capacitance of the piezoelectric element mentioned above.

What is claimed is:

1. Fuel injection system comprising a piezoelectric element (10, 20, 30, 40, 50 or 60) for controlling the amount of injected fuel, characterized in that the fuel injection system comprises a control unit (D) for determination of a possible fault of the piezoelectric element (10, 20, 30, 40, 50 or 60) or of an electric circuitry driving the piezoelectric element (10, 20, 30, 40, 50 or 60) based upon a value related to the capacitance of the piezoelectric element (10, 20, 30, 40, 50 or 60) and in that the control unit determines the value related to the capacitance of the piezoelectric element (10, 20, 30, 40, 50 or 60) based upon the quotient of the second voltage and the charge the piezoelectric element (10, 20, 30, 40, 50 or 60) is carrying, based upon the quotient of the charge the piezoelectric element (10, 20, 30, 40, 50 or 60) is carrying and the second voltage, based upon the quotient of the difference between the second voltage and the first voltage and the product of the charging time and the current charging the piezoelectric element (10, 20, 30, 40, 50 or 60), or based upon the quotient of the product of the charging time and the current charging the piezoelectric element (10, 20, 30, 40, 50 or 60) and the difference between the second voltage and the first voltage.

2. Fuel injection system comprising a piezoelectric element (10, 20, 30, 40, 50 or 60) for controlling the amount of injected fuel, characterized in that the fuel injection system comprises a control unit (D) for determination of a possible fault of the piezoelectric element (10, 20, 30, 40, 50 or 60) or of an electric circuitry driving the piezoelectric element (10, 20, 30, 40, 50 or 60) based upon a value related to the capacitance of the piezoelectric element (10, 20, 30, 40, 50 or 60);

wherein the piezoelectric element (10, 20, 30, 40, 50 or 60) is discharged from a second voltage to a third voltage, characterized in that the control unit determines the value related to the capacitance of the piezoelectric element (10, 20, 30, 40, 50 or 60) based upon the second voltage and the third voltage.

3. Fuel injection system comprising a piezoelectric element (10, 20, 30, 40, 50 or 60) for controlling the amount of injected fuel, characterized in that the fuel injection system comprises a control unit (0) for determination of a possible fault of the piezoelectric element (10, 20, 30, 40, 50 or 60) or of an electric circuitry driving the piezoelectric element (10, 20, 30, 40, 50 or 60) based upon a value related to the capacitance of the piezoelectric element (10, 20, 30, 40, 50 or 60);

wherein the piezoelectric element (10, 20, 30, 40, 50 or 60) is discharged from a second voltage to a third voltage within a discharging time, characterized in that the control unit determines the value related to the capacitance of the piezoelectric element (10, 20, 30, 40, 50 or 60) based upon the discharging time, and, in particular an estimated value of, a current discharging the piezoelectric element (10, 20, 30, 40, 50 or 60).

4. Fuel injection system comprising a piezoelectric element (10, 20, 30, 40, 50 or 60) for controlling the amount of injected fuel, characterized in that the fuel injection system comprises a control unit (D) for determination of a possible fault of the piezoelectric element (10, 20, 30, 40, 50 or 60) or of an electric circuitry driving the piezoelectric element (10, 20, 30, 40, 50 or 60) based upon a value related to the capacitance of the piezoelectric element (10, 20, 30, 40, 50 or 60);

wherein the piezoelectric element characterized in that the control unit determines the value related to the capacitance of the piezoelectric element (10, 20, 30, 40, 50 or 60) based upon the quotient of the third voltage and the charge the piezoelectric element (10, 20, 30, 40, 50 or 60) is carrying, based upon the quotient of the charge the piezoelectric element (10, 20, 30, 40, 50 or 60) is carrying and the third voltage, based upon the quotient of the difference between the second voltage and the third voltage and the product of the discharging time and the current discharging the piezoelectric element (10, 20, 30, 40, 50, or 60) and the difference between the second voltage and the third voltage.

5. Fuel injection system according to claim 2, characterized in that the third voltage equals the first voltage.

6. Fuel injection system according to claim 1, characterized in that the control unit is able to determine a possible fault of the piezoelectric element (10, 20, 30, 40, 50 or 60) or electric circuitry driving the piezoelectric element (10, 20, 30, 40, 50 or 60) based upon a calculated value of the capacitance of the piezoelectric element (10, 20, 30, 40, 50 or 60) and a value related to the capacitance of the piezoelectric element (10, 20, 30, 40, 50 or 60) at a former stage, in particular based upon a comparison of the value related to the capacitance of the piezoelectric element (10, 20, 30, 40, 50, or 60) and a former value related to the capacitance of the piezoelectric element the difference between the second voltage and the third voltage.

7. Fuel injection system according to claim 1, wherein the fuel injection system comprises a switch (11, 21, 31, 41, 51 or 61) for discharging the piezoelectric element (10, 20, 30, 40, 50 or 60), characterized in that the control unit is able to determine a possible short cut of the switch (11, 21, 31, 41, 51 or 61) based upon the value related to the capacitance of the piezoelectric element (10, 20, 30, 40, 50 or 60).

8. A fuel injection system, comprising:
at least two piezoelectric elements configured to control an amount of injected fuel; and
a control unit configured to determine a possible fault of one of the at least two piezoelectric elements and an electric circuitry configured to drive the least two piezoelectric elements in accordance with a value related to a capacitance of the at least two piezoelectric elements,
wherein the control unit is configured to determine a possible fault of one of the at least two piezoelectric elements or the electric circuitry configured to drive the piezoelectric elements in accordance with values related to capacitances of the at least two piezoelectric elements.

9. The fuel injection system according to claim 8, further comprising an arrangement configured to charge the piezoelectric element from a first voltage to a second voltage, the control unit configured to determine the value related to the capacitance of the piezoelectric element in accordance with the first voltage and the second voltage.

10. The fuel injection system according to claim 8, wherein the control unit is configured to determine the value related to the capacitance of the piezoelectric element in accordance with the charging time and an estimated value of the current charging the piezoelectric element.

11. The fuel injection system according to claim 8, wherein the control unit is configured to determine the value related to the capacitance of the piezoelectric element in accordance with a charge carried by the piezoelectric element.

12. A fuel injection system, comprising:
at least one piezoelectric element configured to control an amount of injected fuel;
a control unit configured to determine a possible fault of one of the at least one piezoelectric element and an electric circuitry configured to drive the at least one piezoelectric element in accordance with a value related to a capacitance of the at least one piezoelectric element; and
an arrangement configured to charge the piezoelectric element from a first voltage to a second voltage, the control unit configured to determine the value related to the capacitance of the piezoelectric element in accordance with the first voltage and the second voltage,
wherein the control unit is configured to determine the value related to the capacitance of the piezoelectric element in accordance with a quotient of the second voltage and a charge carried by the piezoelectric element.

13. A fuel injection system, comprising:
at least one piezoelectric element configured to control an amount of injected fuel;
a control unit configured to determine a possible fault of one of the at least one piezoelectric element and an electric circuitry configured to drive the at least one piezoelectric element in accordance with a value related to a capacitance of the at least one piezoelectric element; and
an arrangement configured to charge the piezoelectric element from a first voltage to a second voltage, the control unit configured to determine the value related to the capacitance of the piezoelectric element in accordance with the first voltage and the second voltage,
wherein the control unit is configured to determine the value related to the capacitance of the piezoelectric element in accordance with a quotient of a charge carried by the piezoelectric element and the second voltage.

14. A fuel injection system, comprising:
at least one piezoelectric element configured to control an amount of injected fuel;
a control unit configured to determine a possible fault of one of the at least one piezoelectric element and an electric circuitry configured to drive the at least one piezoelectric element in accordance with a value related to a capacitance of the at least one piezoelectric element; and
an arrangement configured to charge the piezoelectric element from a first voltage to a second voltage within a charging time, the control unit configured to determine the value related to the capacitance of the piezoelectric element in accordance with the charging time and a current charging the piezoelectric element, wherein the control unit is configured to determine the value related to the capacitance of the piezoelectric element in accordance with a quotient of the difference between the second voltage and the first voltage and a product of the charging time and the current charging the piezoelectric element.

15. A fuel injection system, comprising:

at least one piezoelectric element configured to control an amount of injected fuel;

a control unit configured to determine a possible fault of one of the at least one piezoelectric element and an electric circuitry configured to drive the at least one piezoelectric element in accordance with a value related to a capacitance of the at least one piezoelectric element; and an arrangement configured to charge the piezoelectric element from a first voltage to a second voltage within a charging time, the control unit configured to determine the value related to the capacitance of the piezoelectric element in accordance with the charging time and a current charging the piezoelectric element, wherein the control unit is configured to determine the value related to the capacitance of the piezoelectric element in accordance with a quotient of a product of the charging time and the current charging the piezoelectric element and a difference between the second voltage and the first voltage.

16. A fuel injection system, comprising:

at least one piezoelectric element configured to control an amount of injected fuel;

a control unit configured to determine a possible fault of one of the at least one piezoelectric element and an electric circuitry configured to drive the at least one piezoelectric element in accordance with a value related to a capacitance of the at least one piezoelectric element; and an arrangement configured to discharge the piezoelectric element from a second voltage to a third voltage, the control unit configured to determine the value related to the capacitance of the piezoelectric element in accordance with the second voltage and the third voltage.

17. A fuel injection system, comprising:

at least one piezoelectric element configured to control an amount of injected fuel;

a control unit configured to determine a possible fault of one of the at least one piezoelectric element and an electric circuitry configured to drive the at least one piezoelectric element in accordance with a value related to a capacitance of the at least one piezoelectric element; and an arrangement configured to discharge the piezoelectric element from a second voltage to a third voltage within a discharging time, the control unit configured to determine the value related to the capacitance of the piezoelectric element in accordance with the discharging time and a current discharging the piezoelectric element.

18. The fuel injection system according to claim 17, wherein the control unit is configured to determine the value related to the capacitance of the piezoelectric element in accordance with the discharging time and an estimated value of the current discharging the piezoelectric element.

19. The fuel injection system according to claim 16, wherein the control unit is configured to determine the value related to the capacitance of the piezoelectric element in accordance with a quotient of the third voltage and a charge carried by the piezoelectric element.

20. The fuel injection system according to claim 16, wherein the control unit is configured to determine the value related to the capacitance of the piezoelectric element in accordance with a quotient of a charge carried by the piezoelectric element and the third voltage.

21. The fuel injection system according to claim 17, wherein the control unit is configured to determine the value related to the capacitance of the piezoelectric element in accordance with a quotient of a product of the discharging time and the current discharging the piezoelectric element and a difference between the second voltage and the third voltage.

22. A fuel injection system, comprising:

at least one piezoelectric element configured to control an amount of injected fuel;

a control unit configured to determine a possible fault of one of the at least one piezoelectric element and an electric circuitry configured to drive the at least one piezoelectric element in accordance with a value related to a capacitance of the at least one piezoelectric element;

an arrangement configured to charge the piezoelectric element from a first voltage to a second voltage; and an arrangement configured to discharge the piezoelectric element from the second voltage to a third voltage;

wherein the control unit is configured to determine the value related to the capacitance of the piezoelectric element in accordance with the first voltage, the second voltage and the third voltage.

23. The fuel injection system according to claim 22, wherein the third voltage is equal to the first voltage.

24. A fuel injection system, comprising:

at least one piezoelectric element configured to control an amount of injected fuel; and a control unit configured to determine a possible fault of one of the at least one piezoelectric element and an electric circuitry configured to drive the at least one piezoelectric element in accordance with a value related to a capacitance of the at least one piezoelectric element, wherein the control unit is configured to determine a possible fault of one of the piezoelectric element and the electric circuitry in accordance with a calculated value of the capacitance of the piezoelectric element and a value related to the capacitance of the piezoelectric element at a former stage.

25. The fuel injection system according to claim 24, wherein the control unit is configured to determine a possible fault of one of the piezoelectric element and the electric circuitry in accordance with a comparison of the value related to the capacitance of the piezoelectric element and a former value related to the capacitance of the piezoelectric element.

26. The fuel injection system according to claim 8, further comprising a switch configured to discharge the piezoelectric element, the control unit configured to determine a possible short cut of the switch in accordance with the value related to the capacitance of the piezoelectric element.

* * * * *

UNITED STATES PATENT AND TRADEMARK OFFICE
CERTIFICATE OF CORRECTION

PATENT NO.       : 6,705,291 B2                                      Page 1 of 1
APPLICATION NO. : 09/824195
DATED            : March 16, 2005
INVENTOR(S)      : Rueger et al.

It is certified that error appears in the above-identified patent and that said Letters Patent is hereby corrected as shown below:

Column 15, line 17, change "and $\dfrac{C_i}{C_{i+1}} \geq f_{max} \times 0.5$" to $\dfrac{C_i}{C_{i+1}} \leq f_{max} \times 0.5$ --

Column 15, line 63, delete "is"

Column 15, lines 41-63, delete "are met, wherein ... whether the condition" from its present location and insert after the 2$^{nd}$ formula on line 17 (Specification as supplied to PTO had pp. 31 and 32 transposed – Patent as issued reflects this)

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 6,705,291 B2  
APPLICATION NO. : 09/824195  
DATED : March 16, 2004  
INVENTOR(S) : Rueger et al.

Page 1 of 1

It is certified that error appears in the above-identified patent and that said Letters Patent is hereby corrected as shown below:

Column 15, line 17, change "and $\dfrac{C_i}{C_{i+1}} \geq f_{max} \times 0.5$ " to $\dfrac{C_i}{C_{i+1}} \leq f_{max} \times 0.5$ Column 15, line 63, delete "is"

Column 15, lines 41-63, delete "are met, wherein ... whether the condition" from its present location and insert after the 2$^{nd}$ formula on line 17 (Specification as supplied to PTO had pp. 31 and 32 transposed – Patent as issued reflects this)

This certificate supersedes Certificate of Correction issued November 14, 2006.

Signed and Sealed this

Ninth Day of January, 2007

JON W. DUDAS  
*Director of the United States Patent and Trademark Office*